(12) United States Patent
Velic et al.

(10) Patent No.: US 12,432,892 B2
(45) Date of Patent: Sep. 30, 2025

(54) PULSE INVERTER AS WELL AS POWERTRAIN AND METHOD FOR HEATING A COOLANT

(71) Applicant: Dr. Ing. h.c. F. Porsche Aktiengesellschaft, Stuttgart (DE)

(72) Inventors: Timijan Velic, Weissach (DE); Maximilian Barkow, Stuttgart (DE); Pascal Heusler, Stuttgart (DE); Stefan Gatzemann, Sersheim (DE); Jannik Maier, Aichtal (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 252 days.

(21) Appl. No.: 18/310,547

(22) Filed: May 2, 2023

(65) Prior Publication Data
US 2023/0363122 A1 Nov. 9, 2023

(30) Foreign Application Priority Data
May 9, 2022 (DE) .......................... 102022111447.3

(51) Int. Cl.
H05K 7/20 (2006.01)
H02K 11/33 (2016.01)
H02M 7/00 (2006.01)

(52) U.S. Cl.
CPC ......... *H05K 7/20945* (2013.01); *H02K 11/33* (2016.01); *H02M 7/003* (2013.01); *H05K 7/20927* (2013.01)

(58) Field of Classification Search
None
See application file for complete search history.

(56) References Cited

U.S. PATENT DOCUMENTS

| 8,127,564 | B2 | 3/2012 | Takamatsu et al. |
| 11,407,280 | B1* | 8/2022 | Turudic ............... B60L 3/0023 |
| 11,420,082 | B2 | 8/2022 | Ott et al. |
| 11,535,781 | B2* | 12/2022 | Kumakura ............... F24F 1/34 |
| 2012/0049665 | A1* | 3/2012 | Garriga .................. F16C 37/007 |
| | | | 310/54 |
| 2018/0138694 | A1* | 5/2018 | Garcha ..................... H02H 3/14 |
| 2021/0175780 | A1* | 6/2021 | Sano ......................... H02K 3/28 |
| 2022/0231599 | A1* | 7/2022 | Geske ..................... H02M 1/08 |

(Continued)

FOREIGN PATENT DOCUMENTS

DE 102016211763 A1 1/2018
JP 2008189249 A 8/2008

*Primary Examiner* — Courtney L Smith
(74) *Attorney, Agent, or Firm* — LEYDIG, VOIT & MAYER, LTD.

(57) ABSTRACT

A pulse inverter includes a pulse inverter housing, in which at least one power electronics is provided, wherein at least the pulse inverter housing is configured to be cooled by a flowing coolant through housing means. The power electronics includes at least one controller, a gate driver, and a semiconductor element. For switching a semiconductor element, the gate driver provides a turn-on voltage UGS and a turn-off voltage U0 and is actuatable by the controller for this purpose. The controller includes control means, via which a withstand voltage UR<UGS is adjustable, whereby a power dissipation PV can be generated, causing the power electronics and/or the coolant to heat up.

7 Claims, 3 Drawing Sheets

(56) References Cited

U.S. PATENT DOCUMENTS

2023/0261536 A1* 8/2023 Vanhee .................... H02K 7/04
                                                            310/54
2024/0322624 A1* 9/2024 Takahata .................. H02K 9/19

* cited by examiner

PULSE INVERTER AS WELL AS POWERTRAIN AND METHOD FOR HEATING A COOLANT

CROSS REFERENCE TO RELATED APPLICATIONS

This application claims benefit to German Patent Application No. DE 10 2022 111 447.3, filed on May 9, 2022, which is hereby incorporated by reference herein.

FIELD

The invention relates to a pulse inverter having a pulse inverter housing, in which at least one power electronics is provided, wherein at least the pulse inverter housing is to be cooled by a flowing coolant through housing means. Furthermore, the invention relates to a powertrain having such a pulse inverter as well as to a method for heating a coolant in such a powertrain.

BACKGROUND

In an electric powertrain, a pulse inverter is required for the operation of an electric machine. The pulse inverter converts the DC voltage of the battery into a multi-phase AC voltage and has at least one power electronics for this purpose, which cooperates with a gate driver and a controller. It is not absolutely necessary for all of the electronic components to be accommodated in one housing, wherein, in particular, the power electronics can heat up strongly, and therefore must be cooled just like the electric machine in the powertrain. A cooled powertrain in which the pulse inverter and the electric machine are cooled by a flowing coolant, in the present case water, is known from the German patent application DE 10 2016 211 763 A1. In this case, an increased power dissipation of the power electronics, i.e. the electronic components, and/or the electric machine, in particular the stator, is used in order to heat an electrical component, in the present case an energy reservoir, at cold temperatures. This procedure can quickly lead to an overloading and thus damage to the power electronics or even the electric machine.

SUMMARY

In an embodiment, the present disclosure provides a pulse inverter comprising a pulse inverter housing, in which at least one power electronics is provided, wherein at least the pulse inverter housing is configured to be cooled by a flowing coolant through housing means. The power electronics comprises at least one controller, a gate driver, and a semiconductor element. For switching a semiconductor element, the gate driver provides a turn-on voltage UGS and a turn-off voltage U0 and is actuatable by the controller for this purpose. The controller comprises control means, via which a withstand voltage UR<UGS is adjustable, whereby a power dissipation PV can be generated, causing the power electronics and/or the coolant to heat up.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
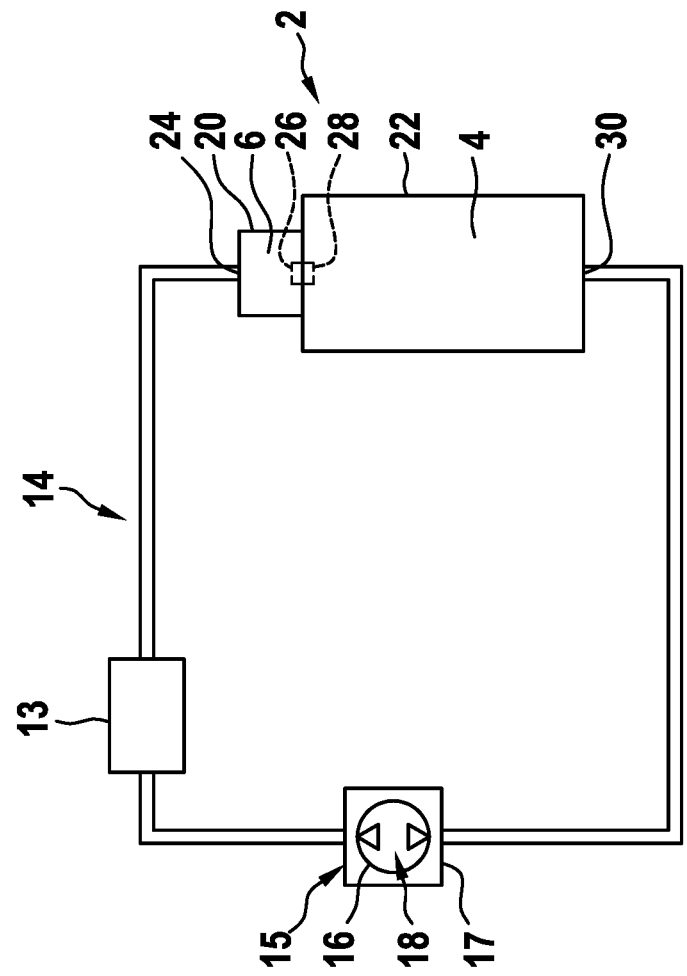
FIG. 1 illustrates a schematic view of a simple electric powertrain having a separate cooling circuit.

In an embodiment, the present invention avoids the aforementioned disadvantages of known pulse inverters and powertrains in a simple and inexpensive manner.

In an embodiment, the power electronics comprises at least one controller, a gate driver, and a power electronics having semiconductor elements, wherein, for switching a semiconductor element, the gate driver provides a turn-on voltage $U_{GS}$ and a turn-off voltage $U_0$ and is actuatable by the controller for this purpose, wherein the controller comprises control means, via which a withstand voltage $U_R<U_{GS}$ is adjustable, whereby a power dissipation $P_V$ can be generated, causing the power electronics and/or the coolant to heat up.

In an embodiment, the power electronics comprises at least one power sensor for detecting an electrical voltage $U_{DS}$ or an electrical current $I_{DS}$. This allows for an accurate temperature control in the coolant circuit.

In an advantageous manner, the pulse inverter housing comprises at least one coolant inlet opening and at least one coolant outlet opening as the housing means, such that the coolant flows through the pulse inverter housing under direct contact with the power electronics, wherein the coolant is a dielectric material. By allowing the dielectric material to completely or partially flow around the power electronics in the pulse inverter housing, a volume-enveloping contact area is created between the power electronics and the dielectric material. The contact area between the power electronics and the dielectric material is thereby significantly increased compared to the prior art. In addition, in the manner of heat exchange described herein, the heat generated in the power electronics is directly absorbed and removed from the flowing coolant. The enlargement of the contact area with simultaneous minimization of the number of heat transitions leads to a substantial increase in cooling and heating efficiency.

An embodiment of the invention provides a powertrain having such a pulse inverter, wherein an electric machine is provided with a cooling circuit having an energy reservoir, wherein the electric machine connects to the pulse inverter, wherein an electric machine housing is likewise configured so as to be perfusible by the coolant.

The pulse inverter, the electric machine, and the energy reservoir can be integrated in the overall vehicle cooling circuit. Advantageously, a separate cooling circuit with a coolant pump and a heat exchanger is provided in order to be able to control the coolant and heat flow in a particularly simple manner. Switching means for changing a perfusion direction of the dielectric material can be provided in order to be able to react simply to special operating situations. The switching means can be constituted in that the direction of rotation of the coolant pump can be changed or that valves can be provided through which the perfusion direction is to be changed.

In an embodiment, the invention provides a method for heating a coolant in such a powertrain, wherein, in a first step, a temperature T is determined by means of a temperature sensor; in a second step, a comparison of the temperature T to a stored temperature threshold is carried out; and, in a third step, a withstand voltage $U_R<U_{GS}$ is set.

Advantageously, in a fourth step, an electrical voltage $U_{DS}$ or an electrical current $I_{DS}$ is detected in the power electronics by at least one power sensor and fed back to the controller as a control variable.

Embodiments of the invention will be explained in further detail with reference to a drawing, in which the following are shown:

FIG. 1 shows a very simple powertrain 2 of an electric vehicle. The powertrain 2 consists of an electric machine 4 and a pulse inverter 6 connected thereto. The pulse inverter 6 converts the DC voltage of a battery into a multi-phase AC voltage for the operation of the electric machine 4 and thus takes over the control of the electric machine 4. For example, the pulse inverter 6 receives a torque request from a drive control unit and implements it by setting the corresponding electrical voltages. For this purpose, the pulse inverter 4 can be constructed from three functional components 8, 10, 12 as shown in further detail in FIGS. 2 and 3. A power electronics 8 contains a so-called commutation cell consisting of the semiconductor element switches and the DC link capacitor. In addition, in the present exemplary embodiment, the sensors for detecting the electrical voltages and the electrical currents are integrated in the power electronics 8. A gate driver 10 is required in order to actuate semiconductor element switches and implements the switching signals of a controller 12.

The controller 12 substantially takes over the control of the electric machine 4 and calculates the AC voltages to be set.

In particular, the power electronics 8 can experience a high degree of heat generation, in addition to the electric machine 4. An energy reservoir 13 for supplying power to the electric machine 4 is also shown. In order to ensure an effective cooling of both the electric machine 4 and the pulse inverter 6, a cooling circuit 14 having a cooling device 15 comprising a coolant pump 16 and a heat exchanger 17 is provided. The coolant pump 16 has a rotation direction reversal as the switching means 18 in order to provide a change of the perfusion direction of a coolant located in the coolant circuit 14.

The coolant circuit 14 is configured such that both a pulse inverter housing 20 and an electric machine housing 22 are configured so as to be perfused by the coolant. For this purpose, the pulse inverter housing 20 has a coolant inlet opening 24 and a coolant outlet opening 26, and also the electric machine housing 22 has a coolant inlet opening 28 and a coolant outlet opening 30, wherein the terms are selected such that first the pulse inverter housing 20 and subsequently the electric machine housing 22 are perfused by the coolant. For a direction reversal, the terms "inlet opening" and "outlet opening" would be switched accordingly. A dielectric material is provided as a coolant here. For example, in the case of cold outside temperatures, the energy reservoir 13 must be quickly brought to operating temperature. The cooling circuit 14 can be used for this purpose, as explained below. A temperature sensor is provided on the energy reservoir 13, which senses the temperature T present on the energy reservoir 13.

Figure 2:
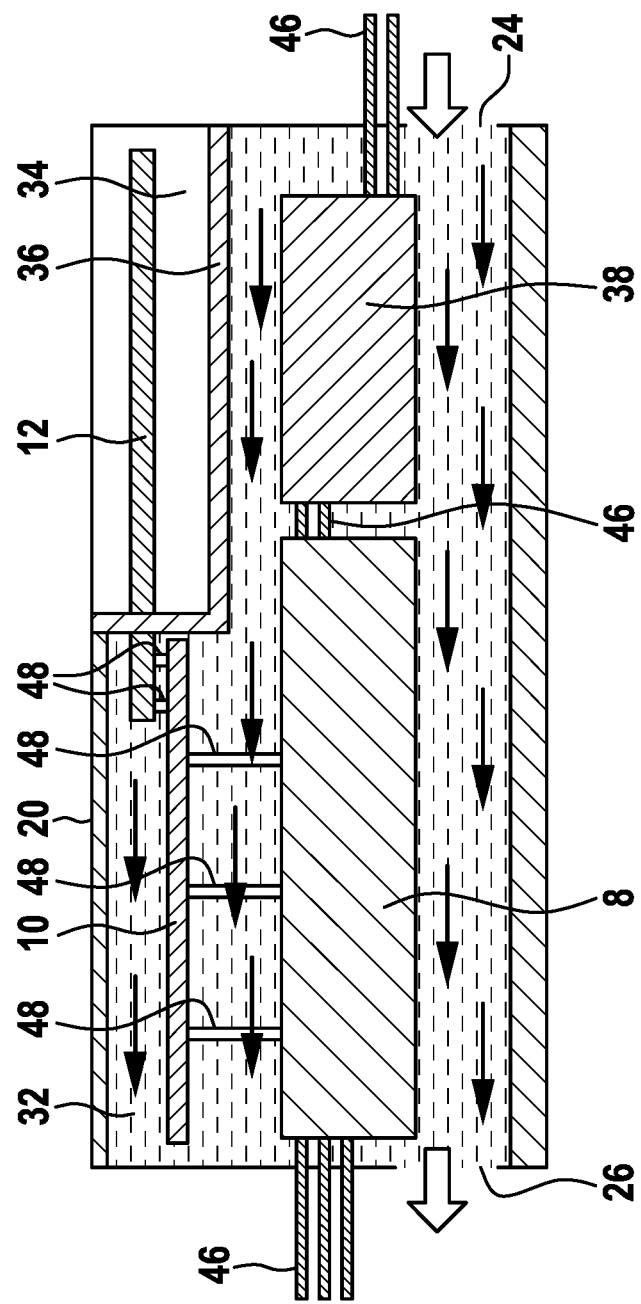
FIG. 2 illustrates a detail view of a first embodiment of a pulse inverter.

FIG. 2 now shows a schematic view of a pulse inverter 6 according to an embodiment of the invention, having the pulse inverter housing 20. In the present exemplary embodiment, in which the pulse inverter 6 is arranged in the direction of flow in front of the electric machine 4, the pulse inverter housing 20 has the coolant inlet opening 24 and the coolant outlet opening 26, which are directly fluidly connected to a wet chamber 32 of the pulse inverter housing 20. The pulse inverter housing 20 also has a dry chamber 34 that is fluidly separated from the wet chamber 32 by a sealing member 36. In the present exemplary embodiment, the power electronics 8, the gate driver 10, and a DC link capacitor 38 are provided in the wet chamber 32, wherein these components 8, 10, 38 are directly surrounded by the flow of the dielectric. The electrical connectors 46 of the power electronics 8 and the DC link capacitor 38 are also surrounded by the flow of the coolant and thereby optimally cooled. Only the controller 12 is provided in the dry chamber 34. The gate driver 10 and the controller 12 are electrically connected to the power electronics 8 via electrical connections 48.

Figure 3:
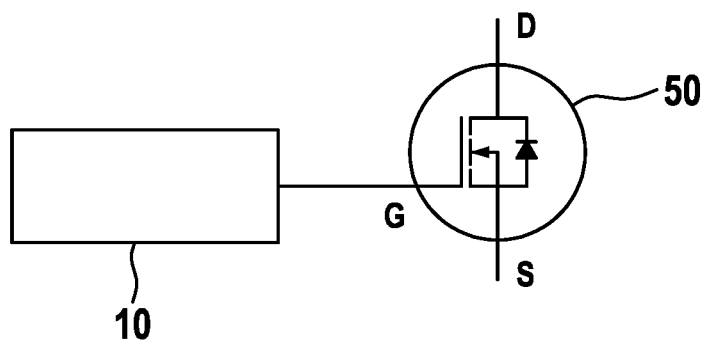
FIG. 3 illustrates a schematic view of a gate driver having a connected semiconductor element.

FIG. 3 now shows a schematic view of a gate driver 10 having a connected semiconductor element 50. If a temperature T on the energy reservoir 13 is now determined that falls below a stored temperature threshold value $T_S$, a so-called withstand voltage $U_R<U_{GS}$ (gate voltage) is set on the gate driver 10, which is required for the dissipation-free switching of the semiconductor element 50. A withstand $R_{DS}$ having a current $I_{DS}$ and a voltage $U_{DS}$ is thereby realized in the simplest manner, which leads to a power dissipation $P_V$ and thus to a heating of the pulse inverter 6 and thus the coolant. The energy reservoir 13 can then be heated to the required operating temperature via the coolant, in turn. In this case, it is advantageous when, in the power electronics 8, an electrical voltage $U_{DS}$ or an electrical current $I_{DS}$ is detected by at least one power sensor and fed back to the controller 12 as a control variable.

Figure 4:
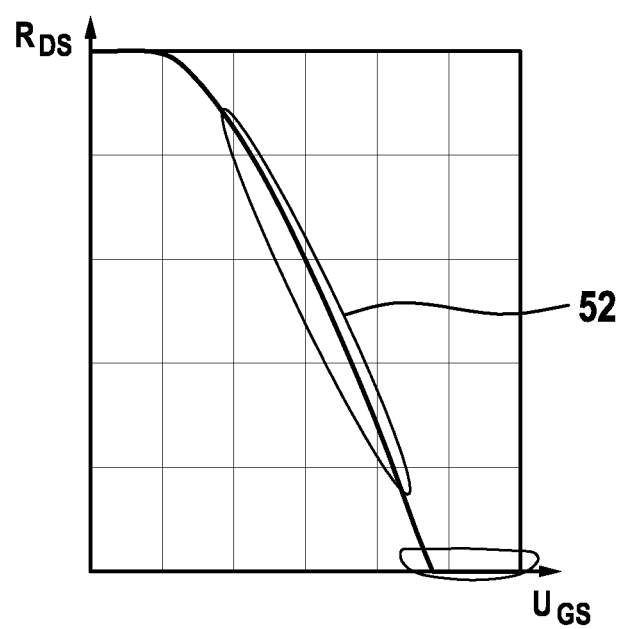
FIG. 4 illustrates a current-voltage plot.

FIG. 4 now shows a plot in which the withstand $R_{DS}$ over the voltage $U_{GS}$ is shown. A range in which the voltage $U_R<U_{GS}$ and consequently a power dissipation $P_V$ and thus heat is produced is designated with the reference numeral 52.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A powertrain comprising:
a pulse inverter comprising:
a pulse inverter housing, in which at least one power electronics is provided,
wherein at least the pulse inverter housing is configured to be cooled by a flowing coolant through housing means,
wherein the power electronics comprises at least one controller, a gate driver, and a semiconductor element,
wherein, for switching a semiconductor element, the gate driver provides a turn-on voltage $U_{GS}$ and a turn-off voltage $U_0$ and is actuatable by the controller for this purpose, and
wherein the controller comprises control means, via which a withstand voltage $U_R < U_{GS}$ is adjustable, whereby a power dissipation $P_V$ can be generated, causing the power electronics and/or the coolant to heat up;
an electric machine with a cooling circuit having an energy reservoir,
wherein the electric machine connects to the pulse inverter,
wherein an electric machine housing is configured so as to be perfusible by the coolant; and
a switch for changing a perfusion direction of the coolant.

2. The powertrain according to claim 1, wherein the power electronics comprises at least one power sensor for detecting an electrical voltage $U_{DS}$ or an electrical current IDS.

3. The powertrain according to claim 1, wherein the pulse inverter housing comprises at least one coolant inlet opening and at least one coolant outlet opening as the housing means, such that the coolant flows through the pulse inverter housing under direct contact with the power electronics, and wherein the coolant is a dielectric material.

4. The powertrain according to claim 1, wherein the pulse inverter, the electric machine, and the energy reservoir are integrated in an overall vehicle cooling circuit.

5. The powertrain according to claim 1, wherein the cooling circuit is provided with a coolant pump and a heat exchanger.

6. A method for heating the coolant in the powertrain according to claim 1, comprising:
in a first step, determining a temperature T by a temperature sensor;
in a second step, carrying out a comparison of the temperature T to a stored temperature threshold $T_S$; and
in a third step, setting the withstand voltage $U_R < U_{GS}$.

7. The method for heating the coolant according to claim 6, comprising, in a fourth step, detecting an electrical voltage $U_{DS}$ or an electrical current $I_{DS}$ in the power electronics by at least one power sensor and feeding back the electrical voltage $U_{DS}$ or an electrical current $I_{DS}$ to the controller as a control variable.

* * * * *